(12) United States Patent
Bernstein et al.

(10) Patent No.: US 8,896,074 B2
(45) Date of Patent: Nov. 25, 2014

(54) MEMS VIBRATION ISOLATION SYSTEM AND METHOD

(75) Inventors: Jonathan Bernstein, Medfield, MA (US); Marc Weinberg, Needham, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 358 days.

(21) Appl. No.: 13/358,744

(22) Filed: Jan. 26, 2012

(65) Prior Publication Data

US 2013/0194770 A1    Aug. 1, 2013

(51) Int. Cl.
*H01L 29/84*      (2006.01)
*H01L 21/00*      (2006.01)

(52) U.S. Cl.
USPC .............................. 257/415; 438/50; 438/51

(58) Field of Classification Search
USPC ........................ 257/415; 438/50, 51
See application file for complete search history.

(56) References Cited

U.S. PATENT DOCUMENTS

| | | | |
|---|---|---|---|
| 7,038,829 B2 | 5/2006 | Bernstein | |
| 7,267,196 B2 * | 9/2007 | Mathur | 181/208 |
| 7,377,167 B2 * | 5/2008 | Acar et al. | 73/504.14 |
| 2003/0218283 A1 | 11/2003 | Yasumura et al. | |
| 2004/0094814 A1 | 5/2004 | Yoshioka et al. | |
| 2005/0189165 A1 * | 9/2005 | Mathur | 181/207 |
| 2012/0130671 A1 * | 5/2012 | Horning et al. | 702/141 |

OTHER PUBLICATIONS

Barillaro, G., Molfes, A. et al., "Analysis, simulation and relative performances of two kinds of serpentine springs," J. of Micromechanics and Microengineering, vol. 15, 2005, p. 736-746.
Bernstein, J. et al., "Scanning OCT Endoscope with 2-Axis Magnetic Micromirror", SPIE BIOS 2007, Jan. 25-27, 2007.
Kwok, P.Y., Weinberg, M.S. and Breuer, K.S., "Fluid Effects in Vibrating Micro-Machined Structures," JMEMS, vol. 14, No. 4, 2005.

* cited by examiner

*Primary Examiner* — Evan Pert
(74) *Attorney, Agent, or Firm* — Lando & Anastasi, LLP

(57) ABSTRACT

A microelectromechanical vibration isolation system includes a microelectromechanical structure having a plurality of fin apertures etched therethrough, and a plurality of fins each disposed within a respective one of the plurality of fin apertures and spaced apart from the microelectromechanical structure so as to define a fluid gap therebetween. The fluid gap is configured to provide squeeze film damping of vibrations imparted upon the microelectromechanical structure in at least two dimensions. The system further includes a frame surrounding the microelectromechanical structure, and a plurality of springs each coupled to the microelectromechanical structure and to the frame. The plurality of springs is configured to support the micromechanical structure in relation to the frame.

26 Claims, 8 Drawing Sheets

MEMS VIBRATION ISOLATION SYSTEM AND METHOD

BACKGROUND

Conventional techniques for isolating objects from vibration include large systems having metal springs, shock absorbers, rubber gaskets, metal mesh springs, oil- or grease-filled dampers, or friction dampers. One disadvantage of the prior techniques is that they utilize macroscopic elements that are large and unsuitable for use in highly compact (e.g., micro-scale) applications. Another disadvantage is that the performance of some conventional dampers is sensitive to temperature variations due to the inherent viscous properties of oil, grease, and polymers. Therefore, these conventional dampers can only achieve critical damping within a narrow range of temperatures, and may be inoperable in temperatures outside of that narrow range. Polymer-based dampers have a further disadvantage in that the polymer can take a permanent set (e.g., the polymer structure doesn't return to its reference position when stress is removed), which, if forming part of a vibration-isolation support structure, can upset the orientation of the supported objects. Other types of dampers that are based on sliding friction or springs can exhibit undesirable hysteresis characteristics.

SUMMARY

Aspects and embodiments are directed to vibration isolation systems and methods for very small (e.g., micro-scale) objects. One aspect includes a microelectromechanical (MEMS) vibration isolation system (VIS) configured to decouple an instrument package or module (e.g., an Inertial Measurement Unit or IMU) from shock and vibration. In one embodiment, the VIS is configured such that the instrument module can be mounted to the VIS. The VIS can be configured to use squeeze film damping for critically damping vibrations imparted externally and/or by the instrument module. For example, a microelectromechanical structure, including a platform for mounting the instrument package thereto, can include a plurality of fin apertures. A plurality of fins can each be disposed within a respective one of the fin apertures and spaced apart from the microelectromechanical structure so as to define a fluid gap therebetween. The fluid gap can be configured to provide squeeze film damping of vibrations imparted upon the microelectromechanical structure in at least two dimensions, as discussed further below. In one embodiment, the fins and gaps are formed by etching slots into a single silicon substrate. The fins and gaps may be simultaneously batch produced.

According to one embodiment, a microelectromechanical vibration isolation system includes a microelectromechanical structure having a plurality of fin apertures etched therethrough, a plurality of fins each disposed within a respective one of the fin apertures and spaced apart from the microelectromechanical structure so as to define a fluid gap therebetween, a frame surrounding the microelectromechanical structure, and a plurality of springs each coupled to the microelectromechanical structure and to the frame. The fluid gap is configured to provide squeeze film damping of vibrations imparted upon the microelectromechanical structure in at least two dimensions. The springs are configured to support the micromechanical structure in relation to the frame.

In one embodiment, the damping ratio can be between 0.2 and 0.7 and the stiffness of the springs can be substantially equal in three translation dimensions.

In one embodiment, the fluid gap may be a first fluid gap. The system may include a substrate mounted adjacent to and spaced apart from the microelectromechanical structure so as to define a second fluid gap between the microelectromechanical structure and the substrate. The second fluid gap may be configured to provide additional squeeze film damping of the vibrations in at least one dimension. In another embodiment, each of the fins may be coupled to the substrate and extend outwardly therefrom. In yet another embodiment, the microelectromechanical structure may include at least one damping region opposing at least a portion of the second fluid gap. The damping region may be free of fin apertures.

In one embodiment, the substrate may be approximately 50 to 1000 microns thick.

In another embodiment, each of the fins may be coupled to the frame and extend outwardly therefrom toward the micromechanical structure.

In one embodiment, the system may include an enclosure surrounding the micromechanical structure. The fluid gap may be a first fluid gap. The micromechanical structure may include at least one damping region spaced apart from at least a portion of the enclosure so as to define a second fluid gap therebetween. The second fluid gap may be configured to provide additional squeeze film damping of the vibrations. The damping region may be free of fin apertures.

In one embodiment, the system may include a plurality of electrical contacts disposed upon the microelectromechanical structure. In another embodiment, each of the springs may be coupled to a respective one of the electrical contacts. In yet another embodiment, the plurality of electrical contacts may include at least one bump bond pad. In yet another embodiment, the plurality of electrical contacts may be a first plurality of electrical contacts. The system may include a second plurality of electrical contacts disposed upon the frame, each of the second plurality of electrical contacts being electrically coupled to a respective one of the first plurality of electrical contacts.

In one embodiment, the microelectromechanical structure may be configured to support an instrument module thereupon. The electrical contacts may be configured to be electrically coupled to the instrument module.

In one embodiment, the fluid gap may contain a gas, such as nitrogen or neon. In another embodiment, the fluid gap may contain an oil or a grease. In yet another embodiment, the fluid gap may be between approximately 2 and 250 microns wide.

In one embodiment, the system may be configured to occupy a volume of approximately 10 cubic millimeters or less.

In one embodiment, at least one of the fins may be concentric with another one of the fins. In another embodiment, the springs may include at least one folded spring. In yet another embodiment, the springs may be configured to provide damping of at least some of the vibrations.

According to one embodiment, a microelectromechanical vibration isolation system includes a microelectromechanical structure having a plurality of recesses etched therein, a frame surrounding the microelectromechanical structure, means for coupling the microelectromechanical structure to the frame such that the micromechanical structure is supported in relation to the frame, and means for damping vibrations imparted upon the microelectromechanical structure including a plurality of damping structures each disposed within a respective one of the recesses.

In one embodiment, the damping structures may be oriented substantially perpendicular to a plane of the microelectromechanical structure. In another embodiment, the damping structures may be oriented substantially parallel to a plane of the microelectromechanical structure. In yet another embodiment, the damping structures may include at least one squeeze film damper. In yet another embodiment, the squeeze film damper may include a gas, such as nitrogen.

In one embodiment, the damping structures may include at least one spring coupled to the microelectromechanical structure and to the frame.

According to one embodiment, a method of making a vibration isolation apparatus includes etching a plurality of fin apertures into a substrate wafer to form a first portion of the substrate wafer having a plurality of fin structures disposed within respective ones of the plurality of fin apertures. The fin apertures form a fluid gap between the fin structures and a second portion of the substrate wafer.

In one embodiment, the method may include etching a frame aperture into the substrate wafer to form a frame configured to surround the second portion of the substrate wafer. In another embodiment, the method may include etching, in the substrate wafer, a plurality of suspension beams for coupling the second portion of the substrate wafer to the frame. In yet another embodiment, the method may include disposing a plurality of first electrical contacts on the second portion of the substrate wafer and a plurality of second electrical contacts on the frame, and coupling each of the first electrical contacts to a respective one of the second electrical contacts using the suspension beams. In yet another embodiment, the method may include injecting a gas, such as nitrogen or neon, into the fluid gap.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure.

In the figures.

DETAILED DESCRIPTION

Figure 1A:
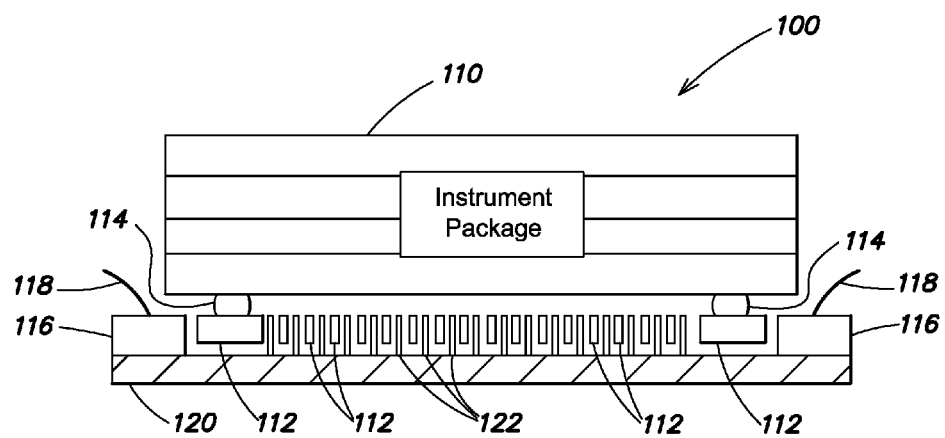
FIG. 1A is a cross-sectional profile view of one example of a vibration isolation system in accordance with aspects of the invention.

Aspects and embodiments relate generally to vibration isolation systems and methods, and more particularly, systems and methods of isolating small instrument packages and other small objects from external vibration and shock. An example of a small object is an inertial measurement unit (IMU), which may include accelerometers, gyroscopes and/or magnetometers. Due to its small mass and weak springs, the IMU can be particularly sensitive to shock and vibration, which can result in errors in the output of the IMU or breakage. For example, if the IMU is used for navigation based on acceleration and rotation, vibration can affect motion measurements. Therefore, it is desirable to isolate the IMU from externally-imparted vibrations.

Due to the small size of the objects being isolated, and the isolation system itself, some embodiments can be classified as microelectromechanical systems (MEMS). One embodiment includes a MEMS-based VIS for isolating small objects from external vibration and shock. Another embodiment includes a MEMS-based VIS configured to prevent small vibrating objects from transmitting energy to the surrounding environment.

As discussed above, some conventional vibration damping techniques utilize macroscopic machined springs, damping elements, polymer supports, or oil/grease to isolate a system from the surrounding environment. Each of these techniques has disadvantages that are overcome by various embodiments. For instance, one embodiment includes small MEMS elements, which enables the VIS to be much more compact than conventional damping systems. Another embodiment uses silicon springs, which have no hysteresis. Yet another embodiment utilizes gas damping, which has a much smaller temperature variation of viscosity than conventional techniques that use oil or grease. Gas viscosity is proportional to the square root of absolute temperature and is independent of pressure and density over a wide range of temperature.

Aspects and embodiments discussed herein are not limited in their application to the details of construction and the arrangement of components set forth in the following description or illustrated in the drawings. The embodiments described herein are capable of being practiced or carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

As used herein, the terms "squeeze film" and "squeezed film" refer to a type of hydraulic or pneumatic damper for damping vibratory motion of a moving component with respect to a fixed component. Squeezed film damping occurs when the moving component is moving perpendicular and in close proximity to the surface of the fixed component (e.g., between approximately 2 and 50 micrometers). The squeezed film effect results from compressing and expanding the fluid (e.g., a gas or liquid) trapped in the space between the moving plate and the solid surface. The fluid has a high resistance, and damps the motion of the moving component as the fluid flows through the space between the moving plate and the solid surface.

Figure 1B:
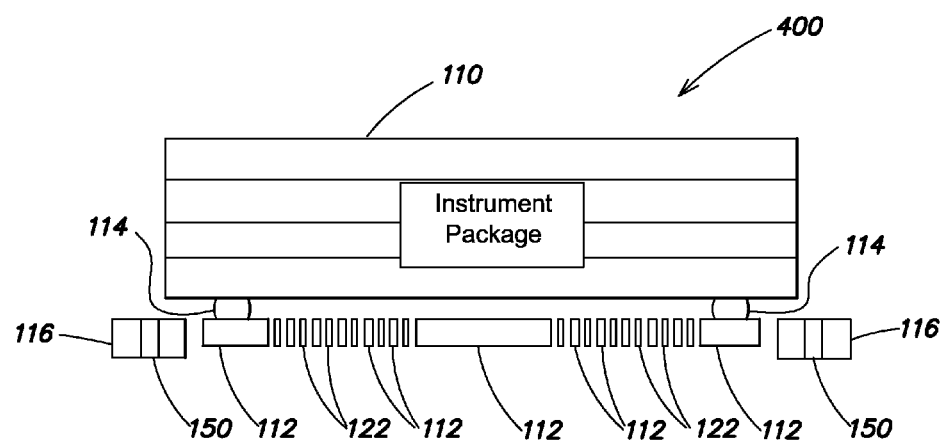
FIG. 1B is a cross-sectional profile view of another example of a vibration isolation system in accordance with aspects of the invention.

FIGS. 1A and 1B are cross-sectional profile views of two examples of a VIS 100, 400, according to at least one embodiment. As shown in the example of FIG. 1A, an instrument module 110, which is not necessarily included in this embodiment, can be mounted on a floating platform 112. Electrical interconnects (not shown) from the instrument module 110 can be brought to the bottom surface of the module 110, where bump bonds 114 or other types of electrical contacts electrically interconnect the instrument module 110 and the floating platform 112. The VIS 100 includes a frame 116 surrounding at least a portion of the floating platform 112, to which one or more electrical interconnects 118 are connected. The electrical interconnects 118 may be connected to an external device (not shown), including, but not limited to, a power supply, a processor, or other electronic device. Examples of electrical interconnects include wires, pins, bumps, traces, etc. As will be discussed below in further detail with respect to FIG. 2A, the electrical interconnects 118 can be electrically connected to the bump bonds 114, enabling electrical signals to travel between the instrument module 110 and the external device through the electrical interconnects 118 and the bump bonds 114.

In one embodiment, the frame 116 is coupled to a substrate 120, which has a fixed position with respect to the floating platform 112 (e.g., the substrate 120 may be mounted to an enclosure). Several damping fins 122 may be coupled to the substrate 120. In one embodiment, the frame 116 and/or damping fins 122 are etched from a single silicon substrate (e.g., an SOI wafer which may include the substrate 120) using a micromachining process, which may be batch fabricated. At least some of the damping fins 122 are used to produce a squeezed film effect between the substrate 120 and the floating platform 112. Such damping fins 122 may be narrow with respect to the surrounding portions of the floating platform 112. Other damping fins and/or other portions of the floating platform 112 (e.g., including the out-of-plane damping regions 134 described below with respect to FIG. 2A), may be wider than the narrow fins 112 to damp motion in the vertical direction (e.g., normal to the substrate 120). In one embodiment, the substrate 120 can be approximately 50 to 1000 microns thick. It is to be appreciated that the substrate 120 is not used in some embodiments, and that the damping fins 122 may, for example, be mounted to the frame 116 or the floating platform 112 instead of the substrate 120, such as shown in the example VIS 400 of FIG. 1B and discussed further below with respect to FIGS. 4A and 4B.

Referring to FIG. 1B, although the instrument package 110 is shown mounted to a central floating platform 112, it is to be understood that the roles of the frame 116 and central platform 112 could be reversed, e.g., the frame 116 can equally well serve as the floating platform 112 while the floating platform 112 can be mounted to an external package. Furthermore, through-silicon vias (TSV's) 150 may be utilized to bring electrical connections from one side of the silicon frame or floating platform 112 to the other side, as shown in FIG. 1B.

Figure 2A:
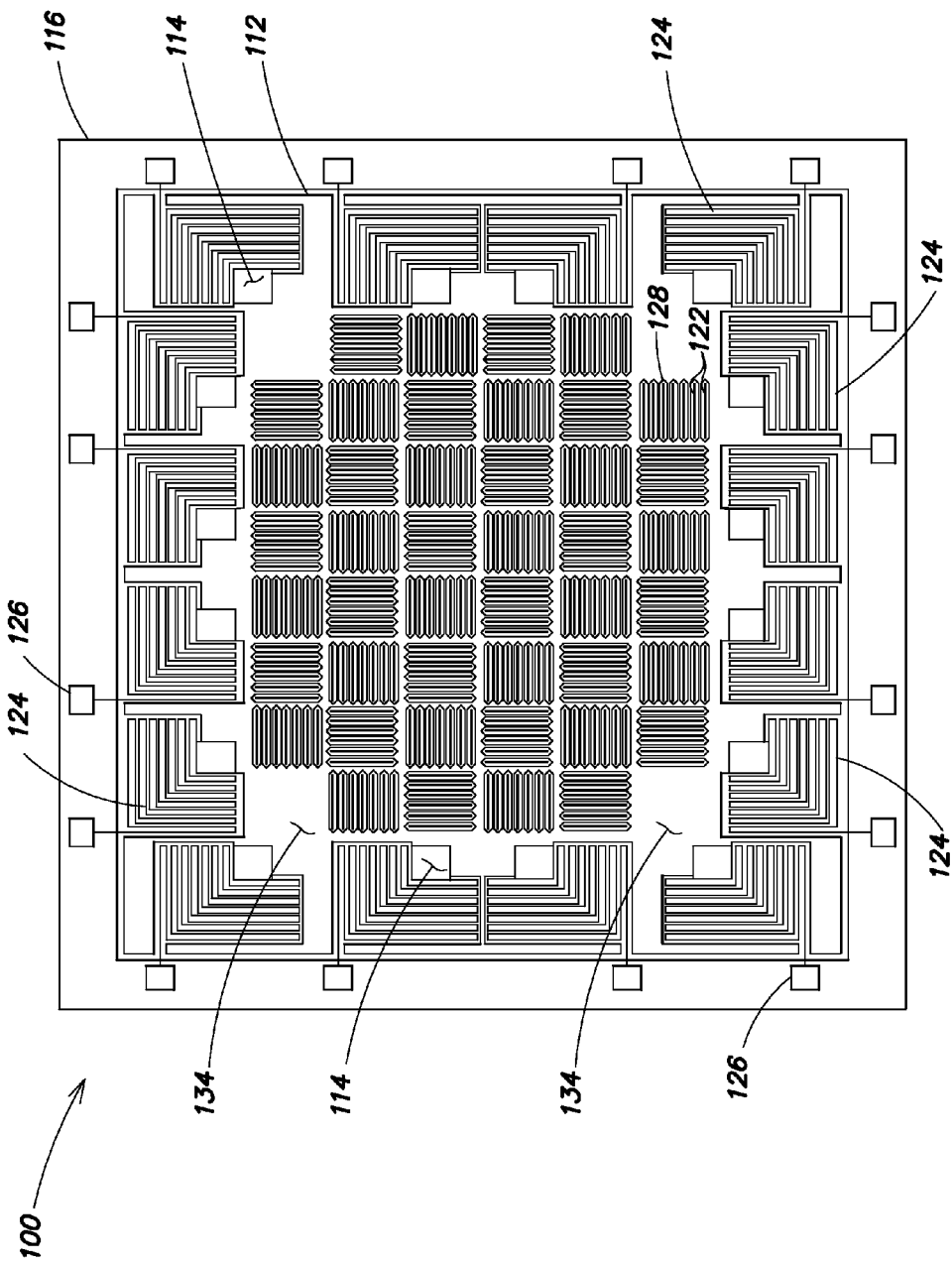
FIG. 2A is a top view of the vibration isolation system of FIG. 1.
Figure 2B:
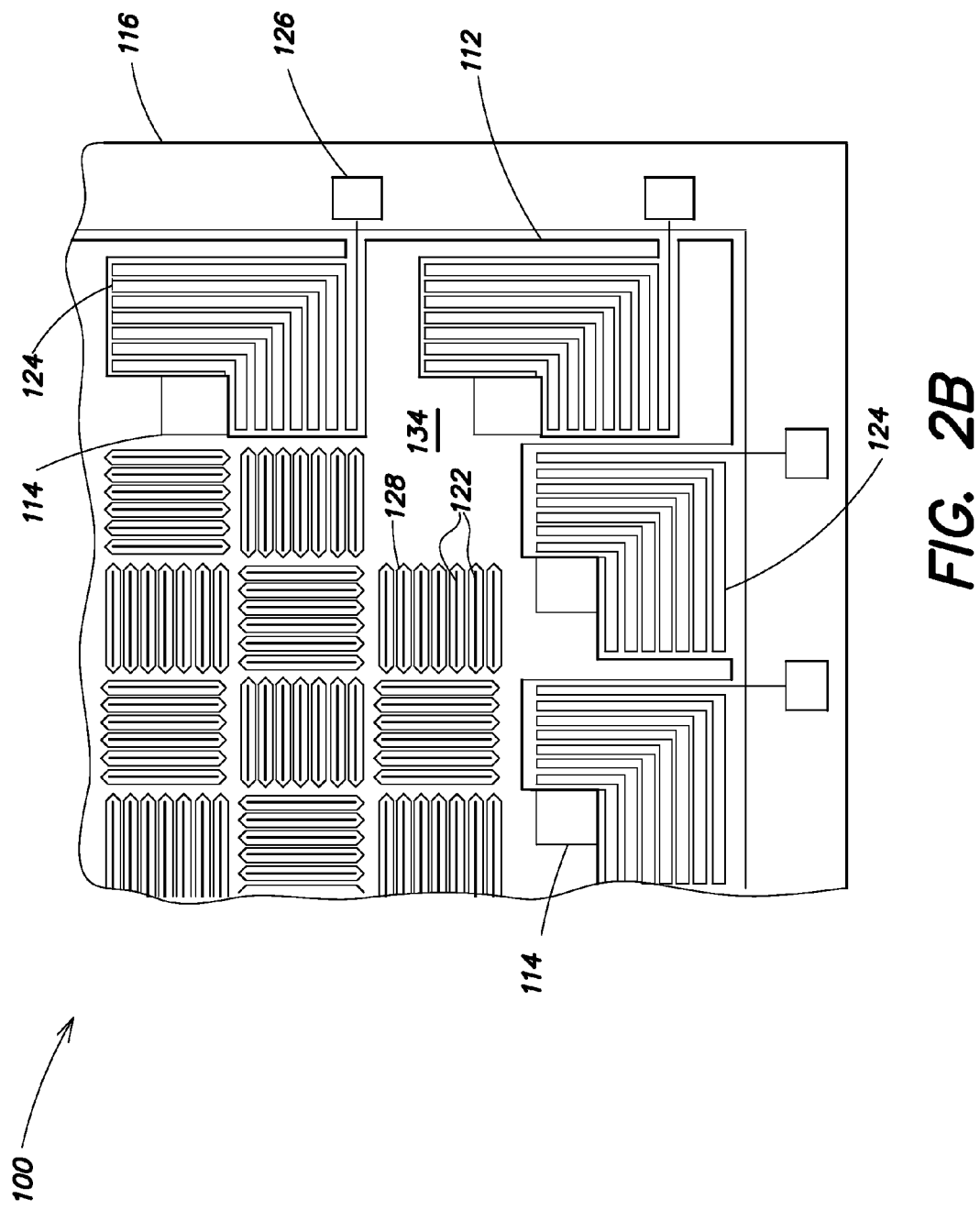
FIG. 2B is a more detailed top view of a portion of the vibration isolation system of FIG. 2A.

FIGS. 2A and 2B are exemplary top views of the VIS 100 of FIG. 1A, according to one embodiment. For clarity, the instrument module 110 is not shown. The floating platform 112 is attached to the frame 116 by a plurality of springs 124 that may also function as electrical interconnects to the instrument module 110 through the bump bonds 114. One end of each spring 124 is coupled to a respective bump bond 114 on the floating platform 112, and the other end of each spring 124 is coupled to a wire-bond 126 or other type of electrical contact mounted to the frame 116. The springs 124 are configured to support the floating platform 112 with respect to the frame 116 and provide at least some vibration damping. A dielectric layer (not shown) covers the surface of the frame 116, springs 124 and floating platform 112, providing dielectric isolation between the metal electrical pads 126 and 114 and the silicon frame and platform.

Figure 2C:
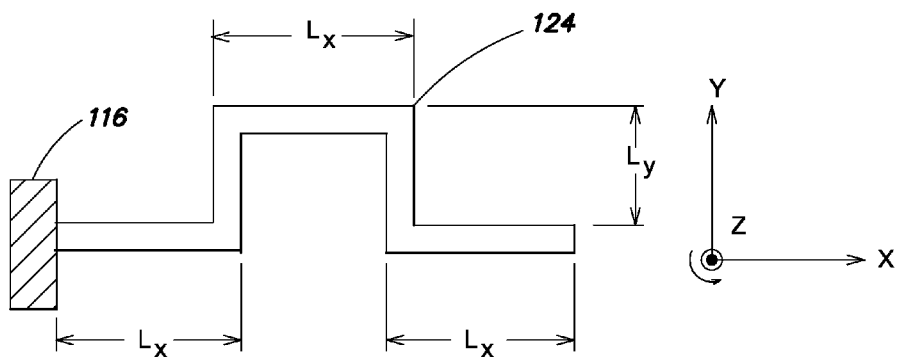
FIG. 2C is a side cross-sectional view of one example of a spring of the vibration isolation system of FIG. 1.

In one embodiment, the springs 124 are folded springs. FIG. 2C shows a top view of one example of a folded spring. The folded springs 124 are designed to provide substantially equal spring constants in three dimensions (e.g., X, Y and Z). Because, in some embodiments, the springs 124 can be configured to resonate at approximately 300 to 500 Hz, most vibration and shock, which typically occurs at higher frequencies, is rejected.

Referring again to FIGS. 2A and 2B, the damping fins 122 are inserted into corresponding fin apertures 128 of the floating platform 112 to provide damping in the X and Y directions (i.e., in the plane of the floating platform 112). This is shown in further detail in FIG. 3, which is a cross-sectional profile view of one portion of the VIS 100 including the damping fins 122, the substrate 120, the floating platform 112 and the fin apertures 128. The fin apertures 128 can be formed, for example, using deep reactive ion etching to create narrow gaps 130 between the floating platform 112 and the damping fins 122. For example, the aspect ratio between the height h of the damping fins 122 and the width w of the gaps 130 may be between approximately 10 to 1 and 100 to 1, which creates a high squeeze film damping coefficient. In one embodiment, the gaps 130 on any side of the damping fins 122 are approximately the same width as the damping fins 122 (e.g., between about 2 and 50 microns wide).

Figure 3:
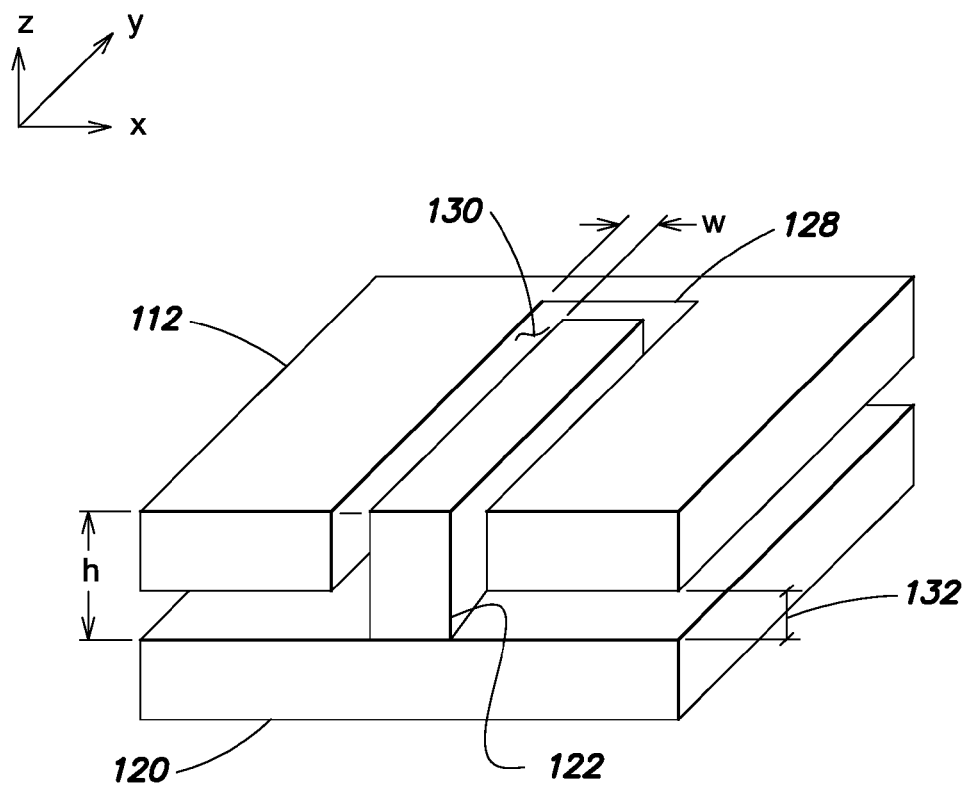
FIG. 3 is a cross-sectional perspective view of one portion of the vibration isolation system of FIG. 1A.

In one embodiment, the gaps 130 are filled with a gas, such as nitrogen or neon, to provide squeeze film damping between the damping fins 122 and the floating platform 112 in at least the X and Y directions. In addition to X and Y damping, the damping fins 122 may dampen motion in the vertical Z direction when the gas is squeezed out or sucked into the gaps 130 through a separation 132 between the floating platform 112 and the substrate 120. In the embodiment of FIG. 3, the damping fins 122 are straight. In other embodiments, the damping fins can be formed in other shapes, such as concentric rectangles or circles.

Referring back to FIGS. 2A and 2B, the floating platform 112 may include one or more out-of-plane damping regions 134 that are free of fin apertures 128 (e.g., the out-of-plane damping regions are solid) and do not contain any damping fins 122. Out-of-plane squeeze film damping (i.e., damping in the Z direction) may be achieved, at least partly, in gaps between the out-of-plane damping regions 134 and the substrate 120.

Figure 2D:
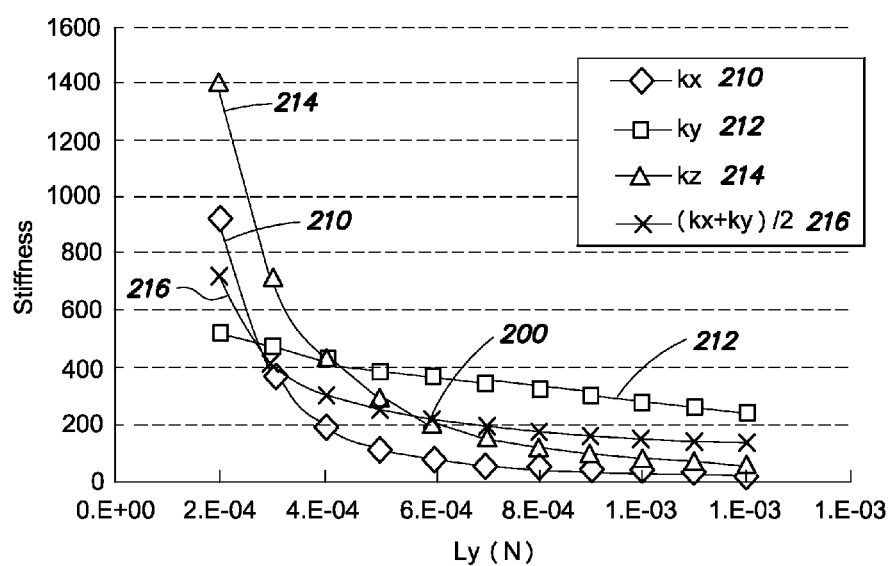
FIG. 2D is a graph illustrating stiffness as a function of vertical length of the spring corresponding to examples of the spring of FIG. 2C, in accordance with aspects of the invention.

In one embodiment, a combination of damping provided by the springs 124 and the gas-based squeeze film damping between the floating platform 112, the damping fins 122 and the substrate 120 provides near critical damping over a wide temperature range (e.g., between approximately −40 and 125 degrees Celsius). The springs may be designed for a wide range of suspension natural frequencies using known closed-form equations or equivalent finite element calculations. FIG. 2D is a graph illustrating stiffness as a function of the length of one example of a beam of the spring 124 of FIG. 2C. Line 210 shows stiffness along the x axis; line 212 shows stiffness along the y axis; line 214 shows stiffness along the z axis; and line 216 shows stiffness as a function of (x+y)/2. For an assumed beam thickness or substrate thickness of 100 microns (z direction), a beam width of 20 microns, and a 150 micron segment length $L_x$, stiffness is plotted as a function of segment length $L_y$ (see FIG. 2D). Because the in-plane springs can consist of two orthogonal sets, the x axis and y axis stiffness may be set equal to one another. From FIG. 2D, the z axis stiffness of the spring 124 equals the average x and y stiffness of the spring 124 when the segment length $L_y$ equals approximately 400 microns. By selecting the number of beams, the desired stiffness and, hence, resonant frequencies can be selected. In one embodiment, the damping ratio can be between 0.2 and 0.7 and the stiffness of the spring 124 can be substantially equal in all three translation dimensions (i.e., x, y, and z). A point of three-axis equal spring stiffness is indicated at 200 in FIG. 2D.

Figure 4A:
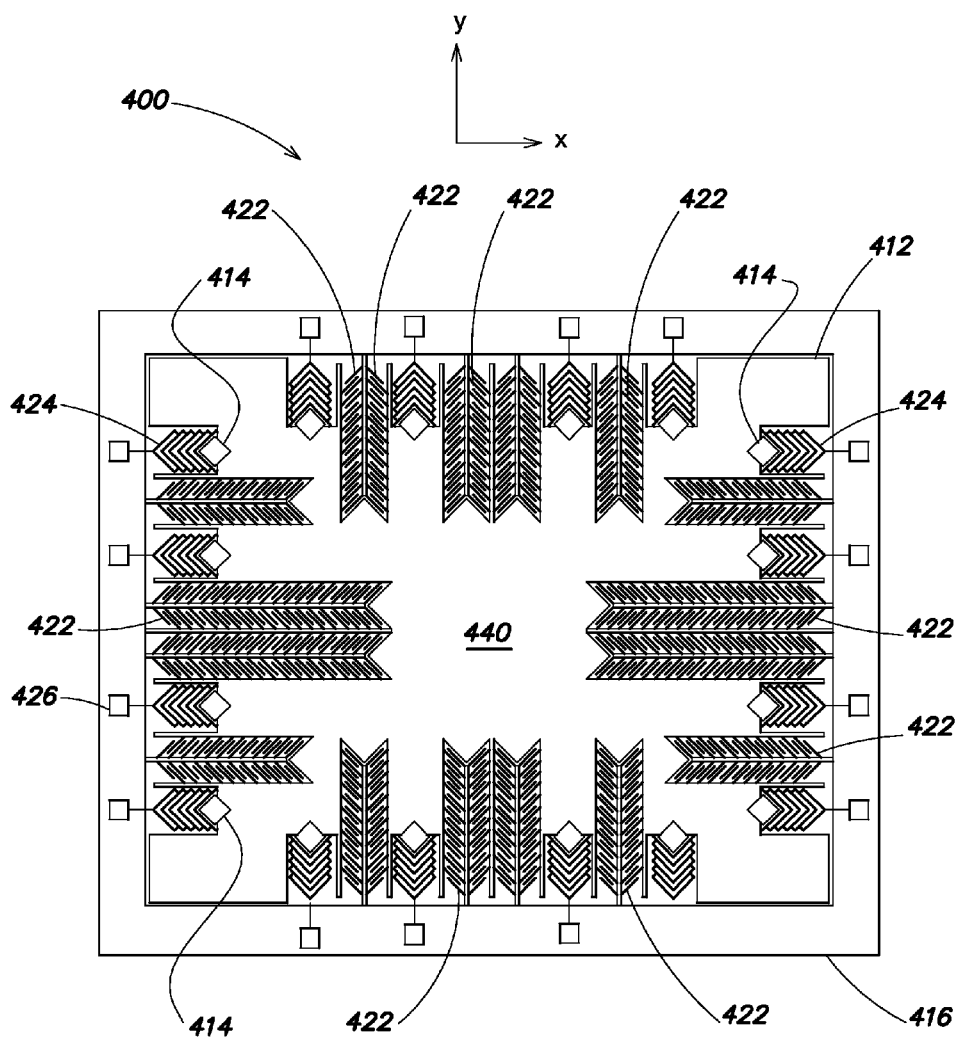
FIG. 4A is a top view of one example of a vibration isolation system in accordance with aspects of the invention.
Figure 4B:
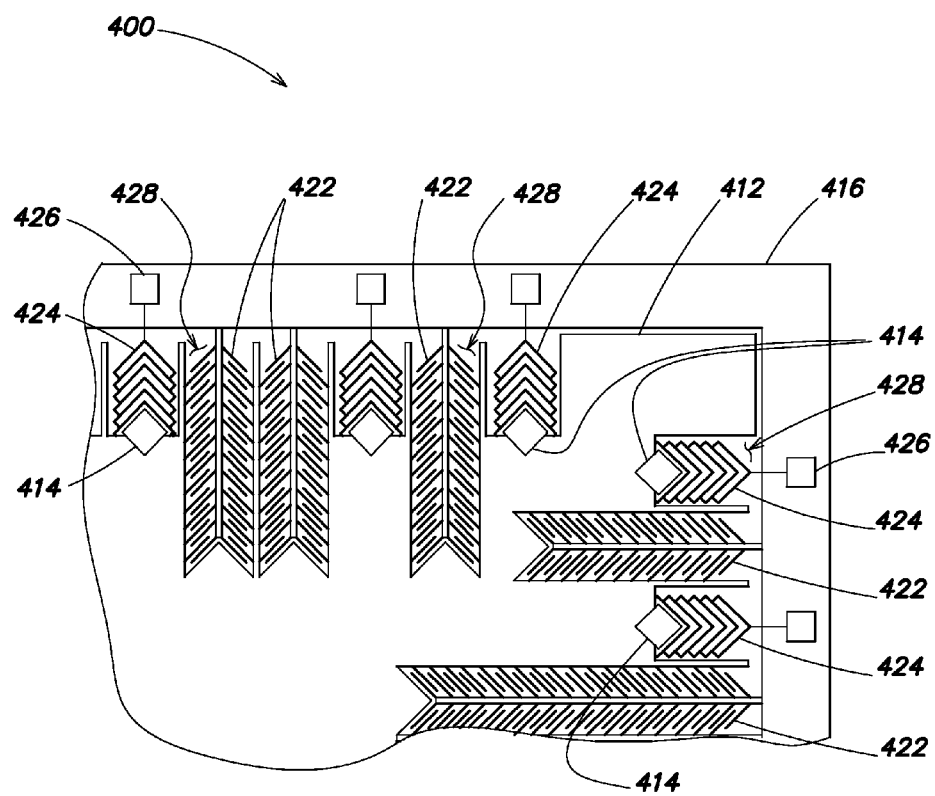
FIG. 4B is a more detailed top view of a portion of the vibration isolation system of FIG. 4A.

FIG. 4A is a top view of one example of the VIS 400 (as shown in FIG. 1B in cross section), according to another embodiment. FIG. 4B is a more detailed view of a portion of the VIS 400 of FIG. 4A. The VIS 400 includes a frame 416 surrounding at least a portion of a floating platform 412. A plurality of wire bonds 426 or other types of electrical contacts are mounted to the frame 416 and electrically connected to one or more electrical interconnects (not shown). The electrical interconnects may be connected to an external device (not shown), including but not limited to a power supply, a processor, or other electronic device.

In contrast to the embodiment of FIGS. 2A and 2B, the VIS 400 of FIGS. 4A and 4B achieves in-plane damping (e.g., in the X and Y directions) without the use of a substrate layer to support damping fins. Instead, a plurality of damping fins 422 are coupled to and protrude from the frame 412 into a plurality of fin apertures 428, which are formed in the floating platform 412. These are shown in FIGS. 4A and 4B as feather-like regions with fins angled at approximately 45 degrees.

The floating platform 412 is attached to the frame 416 by a plurality of springs 424 that also function as electrical interconnects to the instrument module via the bump bonds 414. One end of each spring 424 is coupled to a respective bump bond 414 on the floating platform 412, and the other end of each spring 424 is coupled to one of the wire-bonds 426 mounted on the frame 416. The springs 424 support the floating platform 412 and provide some vibration damping. In one embodiment, the springs 424 can be folded beam structures having 45 degree beams configured to provide equal spring constants in the X and Y directions. In another embodiment, a plurality of out-of-plane limit stops (not shown) can be mounted to the floating platform 412. For example, the out-of-plane limit stops may include one or more hooks for coupling the instrument package to the floating platform 412. The out-of-plane limit stops may be used to restrain the instrument package during high acceleration normal to the floating platform 412.

An instrument module (not shown) can be mounted on the floating platform 412, although it should be understood that the instrument module is not necessarily part of this embodiment. Electrical interconnects from the instrument module can be brought to the bottom surface of the instrument module, where bump bonds 414 or other types of electrical contacts mounted on the floating platform 412 electrically connect the instrument module to the floating platform 412.

In one embodiment, out-of-plane damping (e.g., damping in a direction orthogonal to the floating platform 412) can be achieved by squeeze film damping between a portion of the floating platform 412, such as indicated at 440, and an external package (not shown) that encloses the entire VIS 400 and instrument module.

Figure 5:
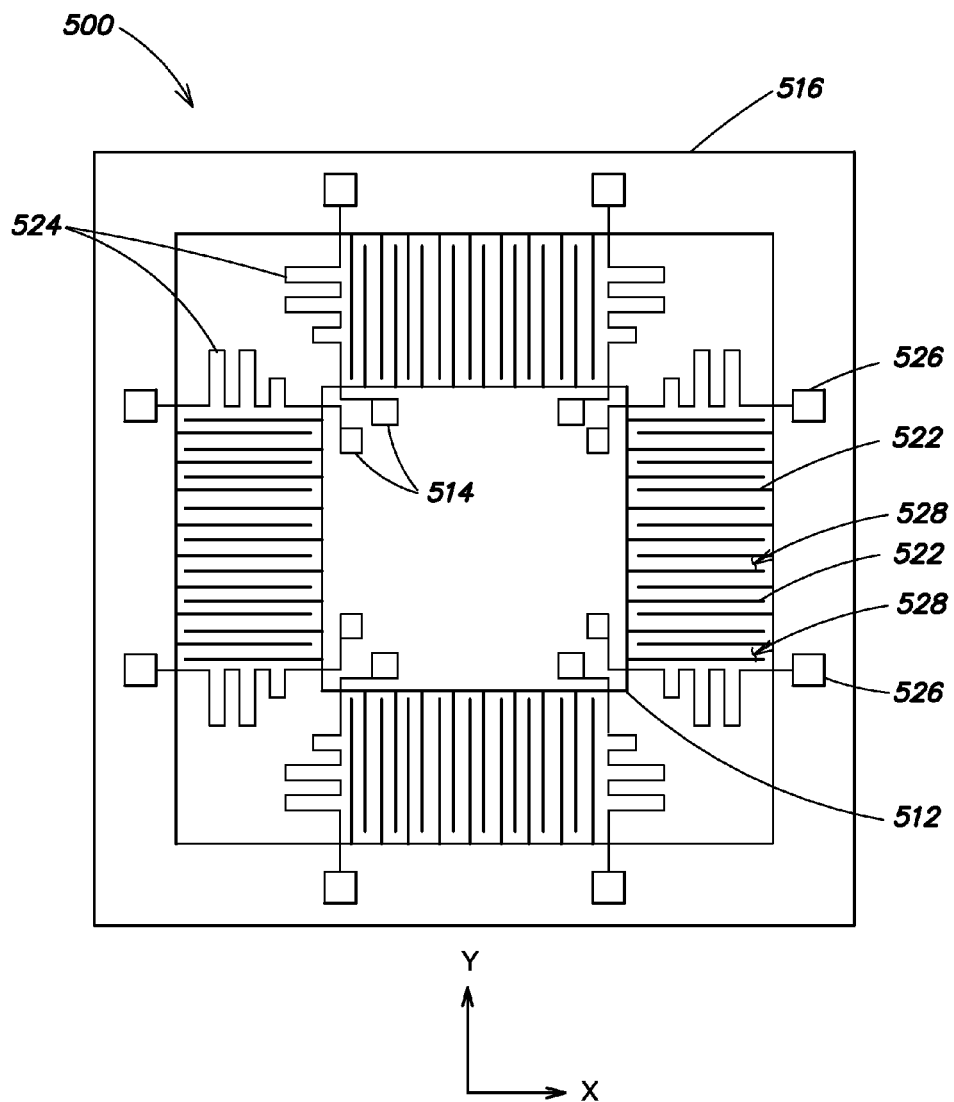
FIG. 5 is a top view of another example of a vibration isolation system in accordance with aspects of the invention.

FIG. 5 is a top view of another example of a VIS 500, according to one embodiment. The VIS 500 is similar to the VIS 400 of FIG. 4A in that it achieves in-plane damping using a single layer wafer. The VIS 500 includes a frame 516 surrounding at least a portion of a floating platform 512. A plurality of wire bonds 526 or other types of electrical contacts are mounted to the frame 516 and electrically connected to one or more electrical interconnects (not shown). The electrical interconnects may be connected to an external device (not shown), including but not limited to a power supply, a processor, or other electronic device. Through silicon vias (TSV's) 150 (see FIG. 1B) may be used to bring electrical signals from one side of the VIS 400 to the other side.

Similar to the embodiment of FIG. 4A, the VIS 500 of FIG. 5 achieves in-plane damping (e.g., in the X and Y directions) without the use of an additional substrate layer to support damping fins. Instead, a plurality of damping fins 522 are coupled to and protrude from the frame 512 into a plurality of fin apertures 528 formed in the floating platform 512. The damping fins 522 are shown in FIG. 5 as orthogonal (straight) beams. Depending on their arrangements, one or more groups of damping fins 522 may be configured to provide damping in the X direction, and one or more other groups of damping fins 522 may be configured to provide damping in the Y direction.

The floating platform 512 is attached to the frame 516 by a plurality of springs 524 that also function as electrical interconnects to the instrument module via the bump bonds 514. One end of each spring 524 is coupled to a respective bump bond 514 on the floating platform 512, and the other end of each spring 524 is coupled to one of the wire-bonds 526 mounted on the frame 516. The springs 524 support the floating platform 512 and provide some vibration damping. In one embodiment, the springs 524 can be folded beam structures having orthogonal beams, as discussed above with reference to FIG. 2C. In another embodiment, a plurality of out-of-plane limit stops (not shown) can be mounted to the floating platform 512. For example, the out-of-plane limit stops may include one or more hooks for coupling the instrument package to the floating platform 512. The out-of-plane limit stops may be used to restrain the instrument package during high acceleration normal to the floating platform 512.

An instrument module (not shown) can be mounted on the floating platform 512, although it is to be understood that the instrument module is not necessarily part of this embodiment. Electrical interconnects from the instrument module can be brought to the bottom surface of the instrument module by TSV's 150, where bump bonds 514 or other types of electrical contacts mounted on the floating platform 512 electrically connect the instrument module to the floating platform 512.

In one embodiment, as discussed above, gas-based squeeze film damping can be used to critically damp the floating platform (e.g., floating platform 112 of FIG. 2A or floating platform 412 of FIG. 4A) and the instrument module mounted thereon. Some examples of gases that may be used include nitrogen, which is readily available, and neon, which has a viscosity 78% greater than nitrogen. Gas viscosity is proportional to the square root of absolute temperature, and is independent of pressure and density over a wide range. For example, in a temperature range from −25 degrees C. to +80 degrees C., there may be a 19% change in viscosity (+/−10% from nominal). Such a change in viscosity will have a minimal effect on a critically damped system, thus enabling the system to perform well over a relatively wide temperature range. By contrast, it is appreciated that many non-gaseous fluids, such as oil, have a very large change in viscosity (e.g., greater than 10:1) over the −25 degree C. to +80 degree C. temperature range. A viscosity change of this magnitude can render a critically damped isolation system inoperable except within a narrow temperature range. Therefore, the use of many non-gaseous fluids can lead to undesirable damping characteristics, particularly in very small-scale applications. However, it will be appreciated that in some systems that are not required to work over a large temperature range, damping by use of an oil or grease may be utilized.

In one embodiment, damping in the X and Y directions can be achieved by inserting many narrow damping fins 120 into the floating platform 112, such as shown in FIG. 2A. By the use of deep reactive ion etching, narrow gaps with aspect ratio of 10-100 can be achieved, leading to high damping coefficients. Consider, for instance, isolator suspension natural frequencies of approximately 300 and 500 Hz, which are typical for applications where the sensor (e.g., an accelerometer) bandwidth is approximately 50 to 100 Hz. Several exemplary damping results, in accordance with one embodiment, are shown in Table 1 below.

TABLE 1

Damping Calculations for Small Inertial Measurement Unit Suspension.

| Descriptor | Units | Symbol | Example 1 10 mm^3, Si | Example 2 10 mm^3, Si |
|---|---|---|---|---|
| PROOF MASS | | | | |
| material | | | silicon | silicon |
| length (shortest dimension) | m | lm | 3.00E−03 | 3.00E−03 |
| width | m | wm | 4.00E−03 | 4.00E−03 |
| thickness | m | tm | 8.33E−04 | 8.33E−04 |
| hole diameter | m | dm | 0 | 0 |
| density | kg/m^3 | rhom | 2330 | 2330 |
| thermal expansion coefficient | 1/K | alpham | 2.50E−06 | 2.50E−06 |
| proof volume | m^3 | Vp | 1.00E−08 | 1.00E−08 |
| proof mass | kg | mp | 2.33E−05 | 2.33E−05 |
| Design acceleration | g | gdes | 5 | 5 |
| design frequency-no rebalance | Hz | fdes | 300.00 | 500.00 |
| | rad/s | wdes | 1.88E+03 | 3.14E+03 |
| required throw | m | gmin | 1.38E−05 | 4.97E−06 |
| designed gap | m | gapdes | 1.38E−05 | 4.97E−06 |
| Gas Damping on IMU | | | | |
| gas viscosity | N-s/m^2 | mu | 3.10E−05 | 3.10E−05 |
| single plate damping | N-s/m | _c1x | 4.00E−02 | 8.57E−01 |
| damping ratio-1 plate | — | zeta1x | 0.46 | 5.85 |
| Air Damping on Fins | | | | |
| machining aspect ratio | — | nm | 25 | 25 |
| % fraction of area for one direction | — | fdamp | 0.25 | 0.25 |
| depth fin-width of damper | m | tfin | 3.45E−04 | 1.24E−04 |
| damping gaps per axis | — | ndamp | 36 | 101 |
| damping for one in-plane direction | N-s/m | _c3x | 4.08E−02 | 1.15E−01 |
| damping ratio-ndamp damping gaps | — | zeta3x | 0.46 | 0.78 |
| include resistance of end flow | N-s/m^5 | Rfin | 5.29E+08 | 4.64E+09 |
| | N-s/m | _c4x | 4.59E−02 | 1.31E−01 |
| damping ratio with end flow resistance | — | zeta4x | 0.52 | 0.89 |

For example, if a 5 g acceleration is input to the VIS 100, the proof mass (as listed in Table 1) may be free to move approximately 14 or 5 micrometers for the 300 and 500 Hz frequencies, respectively. This dimension of movement may be used to determine the gap size (e.g., the distance between the squeeze damping surfaces of the floating platform 112 and one of the fins 122.

If a micromachining aspect ratio of 25 to 1 (i.e., fin height h to gap width w) (see FIG. 3) is assumed, the fin height h, which is the dimension perpendicular to the substrate 120 of FIG. 1, can be determined. With wider gaps, higher fins can be constructed. The results of Table 1 were achieved under the assumption that 25% of the 3×4 mm² chip area is available for lateral damping and that the fin thickness is approximately the same as the gap between fins. Also, the calculations of Table 1 assume that 25% of the plate area is devoted to squeeze film vertical damping. Neon is assumed as the fill gas.

In one embodiment, a VIS has a damping ratio between 0.2 and 0.7 and the spring stiffness is substantially equal for the three translation motions (i.e., in three dimensions).

For the 500 Hz, 5 micrometer case in Table 1, the calculated damping ratios for the vertical (zeta1x) and horizontal (zeta4x) directions may be, for example, 6 and 0.9, respectively. By reducing the length or width of the vertical damper and the number of horizontal damping fins, the desired damping ratios can be achieved. For the 300 Hz, 14 micrometer case, the damping ratios for the vertical (zeta1x) and horizontal (zeta4x) directions may be, for example, 0.5 and 0.5. According to one embodiment, the damping gap is inversely proportional to the bandwidth squared, and the damping effect is inversely proportional to the gap cubed; hence, there is a large difference between vertical damping in the 5 and 14 micrometer movement examples above. The fin width can be determined by the aspect ratio. With narrower gaps, for example, the fin width is smaller; thus, the damping ratio is proportional to the isolator natural frequency.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only, and the scope of the invention should be determined from proper construction of the claims and their equivalents.

What is claimed is:

1. A microelectromechanical vibration isolation system, comprising:

a microelectromechanical structure having a plurality of fin apertures etched therethrough;

a plurality of fins each disposed within a respective one of the plurality of fin apertures and spaced apart from the microelectromechanical structure so as to define a fluid gap therebetween, the fluid gap being configured to provide squeeze film damping of vibrations imparted upon the microelectromechanical structure in at least two dimensions;

a frame surrounding the microelectromechanical structure; and a plurality of springs each coupled to the microelectromechanical structure and to the frame, the plurality of springs being configured to support the micromechanical structure in relation to the frame.

2. The system of claim 1, wherein the fluid gap is a first fluid gap, wherein the system further comprises a substrate mounted adjacent to and spaced apart from the microelectromechanical structure so as to define a second fluid gap between the microelectromechanical structure and the substrate, the second fluid gap being configured to provide additional squeeze film damping of the vibrations in at least one dimension.

3. The system of claim 2, wherein each of the plurality of fins is coupled to the substrate and extends outwardly therefrom.

4. The system of claim 2, wherein the microelectromechanical structure includes at least one damping region opposing at least a portion of the second fluid gap, the at least one damping region being free of fin apertures.

5. The system of claim 2, wherein a thickness of the substrate is in a range of approximately 50 to 1000 microns.

6. The system of claim 1, wherein each of the plurality of fins is coupled to the frame and extends outwardly therefrom toward the micromechanical structure.

7. The system of claim 6, further comprising an enclosure surrounding the micromechanical structure, wherein the fluid gap is a first fluid gap, wherein the micromechanical structure includes at least one damping region spaced apart from at least a portion of the enclosure so as to define a second fluid gap therebetween, wherein the second fluid gap is configured to provide additional squeeze film damping of the vibrations, and wherein the at least one damping region is free of fin apertures.

8. The system of claim 1, further comprising a plurality of electrical contacts disposed upon the microelectromechanical structure.

9. The system of claim 8, wherein each of the plurality of springs is coupled to a respective one of the plurality of electrical contacts.

10. The system of claim 8, wherein the plurality of electrical contacts includes at least one bump bond pad.

11. The system of claim 8, wherein the plurality of electrical contacts is a first plurality of electrical contacts, and wherein the system further comprises a second plurality of electrical contacts disposed upon the frame, each of the second plurality of electrical contacts being electrically coupled to a respective one of the first plurality of electrical contacts.

12. The system of claim 8, wherein the microelectromechanical structure is configured to support an instrument module thereupon, and wherein the plurality of electrical contacts is configured to be electrically coupled to the instrument module.

13. The system of claim 1, wherein the fluid gap contains a gas.

14. The system of claim 13, wherein the gas includes nitrogen.

15. The system of claim 1, wherein the fluid gap contains at least one of an oil and a grease.

16. The system of claim 1, wherein the fluid gap is between approximately 2 and 250 microns wide.

17. The system of claim 1, wherein the system is configured to occupy a volume of approximately 10 cubic millimeters or less.

18. The system of claim 1, wherein at least one of the plurality of fins is concentric with another of the plurality of fins.

19. The system of claim 1, wherein the plurality of springs includes at least one folded spring.

20. The system of claim 1, wherein the plurality of springs is configured to provide damping of at least some of the vibrations.

21. A microelectromechanical vibration isolation system, comprising:

a microelectromechanical structure having a plurality of recesses etched therein;

a frame surrounding the microelectromechanical structure;

means for coupling the microelectromechanical structure to the frame such that the micromechanical structure is supported in relation to the frame; and means for damping vibrations imparted upon the microelectromechanical structure including a plurality of damping structures each disposed within a respective one of the plurality of recesses.

22. The system of claim 21, wherein the plurality of damping structures is oriented substantially perpendicular to a plane of the microelectromechanical structure.

23. The system of claim 21, wherein the plurality of damping structures is oriented substantially parallel to a plane of the microelectromechanical structure.

24. The system of claim 21, wherein the plurality of damping structures includes at least one squeeze film damper.

25. The system of claim 24, wherein the at least one squeeze film damper includes a gas.

26. The system of claim 21, wherein the plurality of damping structures includes at least one spring coupled to the microelectromechanical structure and to the frame.

* * * * *